US009099842B2

(12) United States Patent
Cerutti et al.

(10) Patent No.: US 9,099,842 B2
(45) Date of Patent: Aug. 4, 2015

(54) LASER EMISSION SYSTEMS, HETEROSTRUCTURE AND ACTIVE ZONE HAVING COUPLED QUANTUM-WELLS, AND USE FOR 1.55 MM LASER EMISSION (75) Inventors: Laurent Cerutti, Montpellier (FR); Jean-Baptiste Rodriguez, Montpellier (FR); Eric Tournie, Montpellier (FR)

(73) Assignees: CENTRE NATIONAL DE LA RECHERCHE SCIENTIFIQUE—CNRS, Paris (FR); UNIVERSITE DE MONTPELLIER, Montpellier (FR)

(*) Notice: Subject to any disclaimer, the term of this patent is extended or adjusted under 35 U.S.C. 154(b) by 147 days.

(21) Appl. No.: 13/512,227

(22) PCT Filed: Nov. 26, 2010

(86) PCT No.: PCT/FR2010/000789
§ 371 (c)(1),
(2), (4) Date: Oct. 3, 2012

(87) PCT Pub. No.: WO2011/064475
PCT Pub. Date: Jun. 3, 2011

(65) Prior Publication Data
US 2013/0022074 A1    Jan. 24, 2013

(30) Foreign Application Priority Data

Nov. 27, 2009    (FR) ...................................... 09 05726

(51) Int. Cl.
*H01S 5/34* (2006.01)
*B82Y 20/00* (2011.01)
(Continued)

(52) U.S. Cl.
CPC . *H01S 5/34* (2013.01); *B82Y 20/00* (2013.01); *H01L 33/06* (2013.01); *H01S 5/3403* (2013.01);
(Continued)

(58) Field of Classification Search
CPC ... H01S 5/3403; H01S 5/3407; H01S 5/3425; H01S 5/34306; H01S 5/3406; H01S 5/34
USPC .............................. 372/45.01, 45.011, 45.012
See application file for complete search history.

(56) References Cited

U.S. PATENT DOCUMENTS 4,745,452 A * 5/1988 Sollner ...................... 372/43.01
5,068,867 A * 11/1991 Hasenberg et al. ...... 372/45.012
(Continued)

FOREIGN PATENT DOCUMENTS

JP        02-220490 A    9/1990
JP        2009-259953 A  11/2009

OTHER PUBLICATIONS

Chow et al., "Mid-wave infrared diode lasers based on GaInSb/InAs and InAs/AlSb superlattices," Hughes Research Laboratories. App. Phys. Lett., vol. 67, No. 25, pp. 3700-3702 (Dec. 18, 1995).
(Continued)

*Primary Examiner* — Yuanda Zhang
*Assistant Examiner* — Michael Carter
(74) *Attorney, Agent, or Firm* — Arent Fox LLP (57) ABSTRACT An active zone for a light emission system including a series of layers at least a portion of which consists of antimony semiconductors III-V. The layers are arranged to form at least one quantum well surrounded by barriers for generating a light emission. The active zone also includes at least one layer forming an intermediate barrier arranged relative to the quantum well to form at least two quantum sub-wells coupled with each other. A heterostructure including at least one optical confinement layer surrounding at least one active zone; a laser emission system including one heterostructure deposited onto a substrate; and the use of an active zone for emitting a light beam having a wavelength of 1.55 μm are disclosed.

10 Claims, 7 Drawing Sheets (51) Int. Cl.
H01L 33/06 (2010.01)
H01S 5/343 (2006.01)

(52) U.S. Cl.
CPC ............ H01S 5/3406 (2013.01); H01S 5/3407 (2013.01); H01S 5/3425 (2013.01); H01S 5/34306 (2013.01)

(56) References Cited

U.S. PATENT DOCUMENTS

| | | | |
|---|---|---|---|
| 5,287,377 A * | 2/1994 | Fukuzawa et al. | 372/45.01 |
| 5,502,787 A * | 3/1996 | Capasso et al. | 385/123 |
| 2003/0161369 A1* | 8/2003 | Chang et al. | 372/45 |
| 2003/0202550 A1* | 10/2003 | Goyal et al. | 372/45 |
| 2004/0201008 A1* | 10/2004 | Kunkee et al. | 257/14 |
| 2006/0017063 A1 | 1/2006 | Lester et al. | |

OTHER PUBLICATIONS

Gozu et al, "Molecular beam epitaxy of AlAsSb/AlAs/InGaAs coupled double quantum wells with extremely thin AlAs center barrier," National Institute of Advanced Industrial Science and Technology, Journal of Crystal Growth, vol. 311, pp. 1700-1702 (2009).

Joullie et al., "InAs(PSb)-based "W" quantum well laser diodes emitting near 3.3 μm," Appl. Phys. Lett., vol. 76, No. 18, pp. 2499-2501 (May 1, 2000).

Klein et al., "Heat transfer characteristics of expanded graphite matrices in metal hydride beds," International Journal of Hydrogen Energy, vol. 29, pp. 1503-1511 (Jan. 22, 2004).

Nagase et al., "Enhancement of All-Optical Cross Phase Modulation in InGaAs/AlAsSb Coupled Quantum Wells Using InAlAs Coupling Barriers," IEEE Photonics Technololgy Letters, vol. 20, No, 24, pp. 2163-2185 (Dec. 15, 2008).

Nash et al., "Midinfrared GaInSb/AlGaInSb quantum well laser diodes grown on GaAs," Appl. Phys. Lett., vol. 91, No. 131118, pp. 1-3 (2007).

Rodriguez et al., "GaSb-based, 2.2 μm type-1 laser fabricated on GaAs substrate operating continuous wave at room temperature," Appl. Phys. Lett., vol. 91, No. 023506, pp. 1-2 (Jan. 14, 2009).

Susa, "Design of Double and Triple Quantum Wells for InGaAs-AlAsSb Intersubband Unipolar Semiconductor Lasers," IEEE Journal of Quantum Electronics, vol. 32, No. 1, pp. 20-28 (Jan. 1996).

* cited by examiner

LASER EMISSION SYSTEMS, HETEROSTRUCTURE AND ACTIVE ZONE HAVING COUPLED QUANTUM-WELLS, AND USE FOR 1.55 MM LASER EMISSION

CROSS-REFERENCE TO RELATED APPLICATION

This Application is a National Stage Entry of International Application No. PCT/FR2010/000789, having an international filing date of Nov. 26, 2010; which claims priority to French Application No. 0905726, having a filing date of Nov. 27, 2009; the disclosure of each of which is hereby incorporated in its entirety by reference.

TECHNICAL FIELD

The present invention relates to the field of making light-emission systems with antimony semiconductors III-V, integrated in a monolithic manner on a substrate. This type of source has a significant importance, particularly in the field of long distance optical telecommunications where the emission/reception is achieved at a wavelength equal to 1.55 μm.

It more particularly relates to an active zone for a light emission system, including a series of layers, at least a portion of which consists of antimony semiconductors III-V, these layers being arranged so as to form at least one quantum well surrounded by barriers with a view to generating a light emission.

It also relates to a heterostructure comprising at least an optical confinement layer surrounding at least such an active zone, a laser emission system comprising such a laser heterostructure deposited on a substrate, as well as using such an active zone with a view to emitting a light beam having a wavelength of 1.55 μm.

PRIOR ART

One of the issues in the field of achieving light emission systems consists in being able to use the antimony-based semiconductors in an optimal manner (III-Sb), by putting their unique properties to good use. In fact, the latter exhibit variable band couplings, low carrier effective masses, as well as a large range of gaps ranging from the near infrared to the medium infrared.

In this respect, several arrangement of layers have been disclosed to emit at wavelengths ranging between 2.1 and 2.5 μm (infrared spectrum for which the absorption of atmospheric water molecules is very low), or more generally at wavelengths ranging between 1.9 and 3.1 μm.

Particularly, the "Room temperature operation of a 2.25 μm electrically pumped laser fabricated on a silicon substrate" publication (Rodriguez et al.; Applied Physics Letters; No. 94; p.061124; 2009) describes a structure making it possible to generate a laser emission at 2.25 μm, comprising:
 a Silicon substrate (Si)
 a pseudo-substrate comprising:
 a nucleation layer in aluminium antimony alloy (AlSb) and
 a thick buffer layer in gallium antimony alloy (GaSb),
 a first n-doped confinement layer ($Al_{0.90}Ga_{0.1}0As_{0.06}Sb_{0.94}$),
 an active zone, inserted at the center of a wavelength of a thickness of 600 nm ($Al_{0.35}Ga_{0.65}As_{0.03}Sb_{0.97}$), comprising:
 two quantum wells of a thickness of 11 nm ($Ga_{0.65}In_{0.35}As_{0.06}Sb_{0.94}$) and
 a barrier with a thickness of 30 nm ($Al_{0.35}Ga_{0.65}As_{0.03}Sb_{0.97}$)
 a second p-doped confinement layer ($Al_{0.90}Ga_{0.10}As_{0.06}Sb_{0.94}$) and
 a contact layer (GaSb).

This stacking of layers may he achieved based on vapour phase deposition methods or by molecular beam epitaxy. The resulting Quantum wells are so-called of type I, i.e., that the probability of presence of electrons and holes are maximum at the same location of the structure. The positions of the energy levels of the electrons and holes are identical whatever the number of quantum wells in the structure. Thus, it is to be considered that the two quantum wells are not coupled.

The substrate is generally constituted in gallium antimonide (GaSb), in indium arsenide (InAs), in gallium arsenide (GaAS) or in Silicon (Si). It may be n or p doped, or semi-insulating. Its thickness is typically of the order of 400 to 500 μm.

The buffer layer (or pseudo-substrate) makes it possible to initiate the epitaxial growth. It improves the crystalline quality of the surface on which the heterostructure is epitaxied. It is composed of a stacking of layers AlSb and GaSb, in the case of a silicon substrate, of GaSb in the case where the substrate is in GaSb or GaAs, or of InAs in the case where the substrate is in InAs. The doping may be of n or p type.
Its thickness is typically of a few hundred nanometers to a few micrometers. It may also serve as a lower contact layer.
The optical confinement layers are lattice matched on GaSb or InAs. They are generally in AlGaAsSb (with 40% to 95% of aluminium). Their thickness is typically of one to several micrometers. The doping of the lower layer is of the same type as the buffer layer, that of the upper layer is opposite to that of the lower layer.

Depending on the chosen light emission mode, wavelength layers may be added. They are generally in AlGaAsSb (with 0% to 70% aluminium), lattice matched to GaSb or InAs. Their refractive index is higher than that of the optical confinement layers, in order to ensure the guiding of a wave. They exhibit a ratio of aluminium smaller than that of the optical confinement layers, in order to decrease the energy of forbidden bands and increase the refractive index. They are in general weakly doped, or undoped.

The active zone forms the core of the laser heterostructure. It is composed of a stacking of two materials usually weakly doped or undoped, one with higher energy of forbidden band (the barrier) than the other (the quantum well). The barrier is in AlGaAsSb (with 0% to 70% of aluminium) and the well in GaInAsSb (with 0% to 60% of indium). A laser heterostructure typically comprises between one and five quantum wells.

At the active zone, the composition of each material fixes its "gap", i.e., the energy separation between its conduction and valence bands. The light emission wavelength is determined by the gap of barriers and quantum wells, the coupling of bands at the well/barrier interface and the thickness of the wells and barriers.

The energy barrier or confinement energy is defined as the gap separating the confined level on which the particle is found (electron or hole) and the band edge (conduction or valence) of the barriers. It participates in the thermal stability of the resulting device: if it is weak, a particle can easily exit the well once the temperature increases, whereas if it is high the particle remains confined in the well despite a temperature increase.

Furthermore, any difference in lattice parameters between the Quantum well and its barrier induces a constraint in the Quantum well. This constraint is traditionally written $\epsilon=(a_{well}-a_{barrier})/a_{well}$ where $a_i$ is the lattice parameter of i. It modifies the band structure of the Quantum well (gap between bands, effective masses, density, states, . . . ) and hence impacts the performance of the lasers based on this active zone. A compressive constraint ranging between $\epsilon=1\%$ and $\epsilon=2\%$ is generally used for obtaining the lasers exhibiting the best performance (see publication "Band-structure engineering in strained semiconductor lasers", O'Reilly et al.; IEEE Journal of Quantum Electronics; Vol.30; N.2; p.366; February 1994).

Moreover, the active zone gain is proportional to its volume.

This type of antimony-based active zone architecture makes it possible to achieve efficient components only in a range of wavelengths extending from 1.9 to 3.1 µm.

The technical problem which is thus, posed hence relates to the manufacture of an active zone based on antimony semiconductors (III-Sb) which allows for an efficient light emission at wavelengths less than 1.8 µm, and more particularly at a wavelength of 1.55 µm for optical telecommunication applications.

A solution, to decrease the wavelength to 1.55 µm, consists in reducing the proportion of indium and to get rid of the arsenic within the well and to reduce the well thickness. However, a weak thickness is harmful to the well efficiency, in as far as the recovery of the wave function of the electrons and holes, the confinement energy of the carriers in the well and the probability of capture of the carriers in the well are weak.

Furthermore, the constraint is thus reduced, thus resulting in a drop of the system performance.

For all these reasons, the light sources of the antimony based semiconductors (III-Sb) are rather used in the 1.9 to 3.1 µm range.

A few arrangements of structures based on antimony semiconductors (III-Sb) have nevertheless been disclosed, such as for example in the publication "Ga1nSb/AlGaAsSb strained Quantum well semiconductor lasers for 1.55 µm operation" (Almuneau et al.; Semicond Sci. Technol.; No.14; pp.89-92; 1999). The structure of the active zone is thereto composed in the following manner:

a first barrier ($Al_{0.35}Ga_{0.65}As_{0.02}Sb_{0.98}$),
a succession of quantum wells ($Ga_{0.96}In_{0.04}Sb$) and alternating barriers ($Al_{0.2}Ga_{0.8}As_{0.02}Sb_{0.98}$),
a last barrier ($Al_{0.35}Ga_{0.65}As_{0.02}Sb_{0.98}$), An identical structure is also described in publication "1.54 µm GaSb/AlGaSb multi-quantum-well monolithic laser at 77 K grown on miscut Si substrate using interfacial misfit arrays" (Jallipalli et al.; Electronic Letters; Vol. 43; No. 22; 2007.

Such heterostructures exhibit two major drawbacks. On one hand, the quantum well is very narrow, thus, leading to a weak confinement, a weak recovery of wave functions and a weak gain. On the other hand, the constraint of the well is very weak ($\epsilon \sim 0.25\%$). In order to obtain a laser emission at 1.55 µm, these architectures of the prior art require either a cryogenic temperature, or an ambient temperature but in pulsed operating regime.

For these reasons, the performance of these components, and particularly the threshold current density, are unsatisfactory and incompatible with the optical telecommunication applications.

Consequently, the issue of the design of an active zone has not been resolved in the prior art, for achieving a light emission system based on antimony semiconductors (III-Sb), which is liable to emit at wavelengths less than 1.8 µm (particularly of the order of 1.55 µm), while maintaining performance compatible with optical telecommunication applications.

OBJECT OF THE INVENTION

A purpose of the invention is hence to achieve an active zone exhibiting a confinement and a mismatch lattice parameter allowing for a light emission which is efficient at wavelengths less than 1.8 µm.

This issue is resolved according to the invention by an active zone such as previously described, also comprising at least a layer capable of forming an intermediary barrier, arranged with respect to a quantum well such as to form at least two quantum sub-wells coupled to each other.

The coupling is translated by the fact that the positions of the energy levels of the electrons and the holes depends on the number of quantum sub-wells. Moreover, the assembly of quantum sub-wells and intermediary barriers is comparable to a unique quantum well of type I, i.e. that the presence probability of the electrons and the holes is maximum at the same location of the assembly. This configuration is distinguished from quantum structures of type II for which the presence probability of electrons and holes are maximum at different locations of the structure. This coincidence or presence probability maxima of electrons and holes makes it possible for the quantum well of type I, obtained by the coupling, to be more efficient for emitting light.

Thanks to the invention, the separation of at least one quantum well is achieved in several sub-layers by adding between these sub-layers an additional layer comprising a material (for example aluminium, phosphorous, etc.), in a composition and a thickness such that this new material may play the role of intermediary barrier and the sub-layers thus constituted become quantum sub-wells coupled to each other.

These intermediary barriers make it possible to maintain an emission wavelength less than 1.8 µm, while increasing the mismatch lattice parameter and the thickness of the quantum wells of the active zone. The parametric mismatch makes it possible to increase the constraint in the well factor improving the lasers performance (cf O'Reilly). Increasing the thickness of the well increases the volume and hence the laser gain, and the recovery of the wave functions of the electrons and holes, i.e., the efficiency of light emission. Moreover, the probability of presence of the electrons and the holes are maximum at the same location of the assembly, the resulting quantum well is thus of type I.

The skilled person will understand that the invention can be compared with a classic structure with a simple quantum well, with which one seeks to achieve a laser emission at a wavelength chosen beforehand (less than 1.8 µm). Thus, here it is sought to obtain the same emission characteristics (in terms of wavelength) with the system according to the invention as those that would be obtained with a simple quantum well system.

Thanks to the addition of these intermediary barriers, to obtain these same characteristics, a plurality of highly coupled sub-wells is constituted, whereof the sum of the thicknesses is higher than that of the simple quantum well. The total thickness of the well resulting from the addition of the material is hence higher than that of a classic quantum well, thus offering a better confinement of electrons, without affecting the light emission wavelength or the thermal stability of the device.

Furthermore, adding these intermediary barriers makes it possible, given their properties (particularly that of decreasing the emission wavelength), the adding of more important mismatch lattice parameter materials (whereof however, a property is to increase the emission wavelength) in the quantum sub-wells.

Preferably, all the layers of the active zone are composed of antimony-based semi-conductor materials III-V. Thus constituted, the active zone may be integrated in a heterostructure (itself preferably composed of these same materials), with a view to a monolithic integration to a substrate of GaSb, InAs, of GaAs, of Si or other. In order to emit at a wavelength of 1.55 µm starting from an antimony-based layer composition, it is particularly well adapted to have aluminium in the sub-barriers. Thus, preferably, a material constituting at least a layer forming an intermediary barrier comprises at least an element from amongst the aluminium (Al) and the phosphorous (P).

The person skilled in the art will note that it is possible to obtain an effect identical to any element that makes it possible to increase the gap of material of the quantum well, for example with phosphorous instead of the aluminium.

In order to promote the coupling of the quantum sub-wells, it is provided that the thickness of at least one layer forming an intermediary barrier be weak.

The invention also relates to a heterostructure for a light emission system, comprising at least an optical confinement layer surrounding at least an active zone according to any one of the above embodiments.

Preferably, all the layers of this heterostructure are composed of antimony-based semi-conductor material III-V, thus making it possible for a monolithic integration of the heterostructure to a substrate of GaSb, of GaAs or Si.

According to a first alternative embodiment, the heterostructure comprises at least two layers able to form a light wavelength with a view to generating a laser emission by the wafer of this heterostructure.

According to a second alternative embodiment, the heterostructure comprises at least two reflective layers able to form an optical cavity with a view to generating a laser emission through the surface of this heterostructure.

According to a third alternative embodiment, the heterostructure is arranged such as to form an electroluminescent diode.

The invention also relates to a light emission system comprising a laser heterostructure according to any one of the above embodiments, this heterostructure being deposited on a substrate.

The invention finally relates to the use of an active zone according to any one of the above embodiments, with a view to emitting a light beam at a wavelength substantially equal to 1.55 µm.

For this, according to a particular embodiment, the layers of the active zone are made from antimony (Sb), indium (In), arsenic (As), gallium (Ga), as well as from at least an element amongst aluminium (Al) and phosphorous (P), in proportions and with layer thicknesses determined such as to generate a laser emission (9) at a wavelength substantially equal to 1.55 µm.

BRIEF DESCRIPTION OF THE DRAWINGS

The invention will be better understood upon reading the detailed description of a non limitative embodiment, accompanied with figs. respectively representing:

FIG. 4, a graphic representing the levels of electrons and

For a better readability of these figures, identical numerical references relates to similar technical elements.

DETAILED SUMMARY OF PARTICULAR EMBODIMENTS

Figure 1:
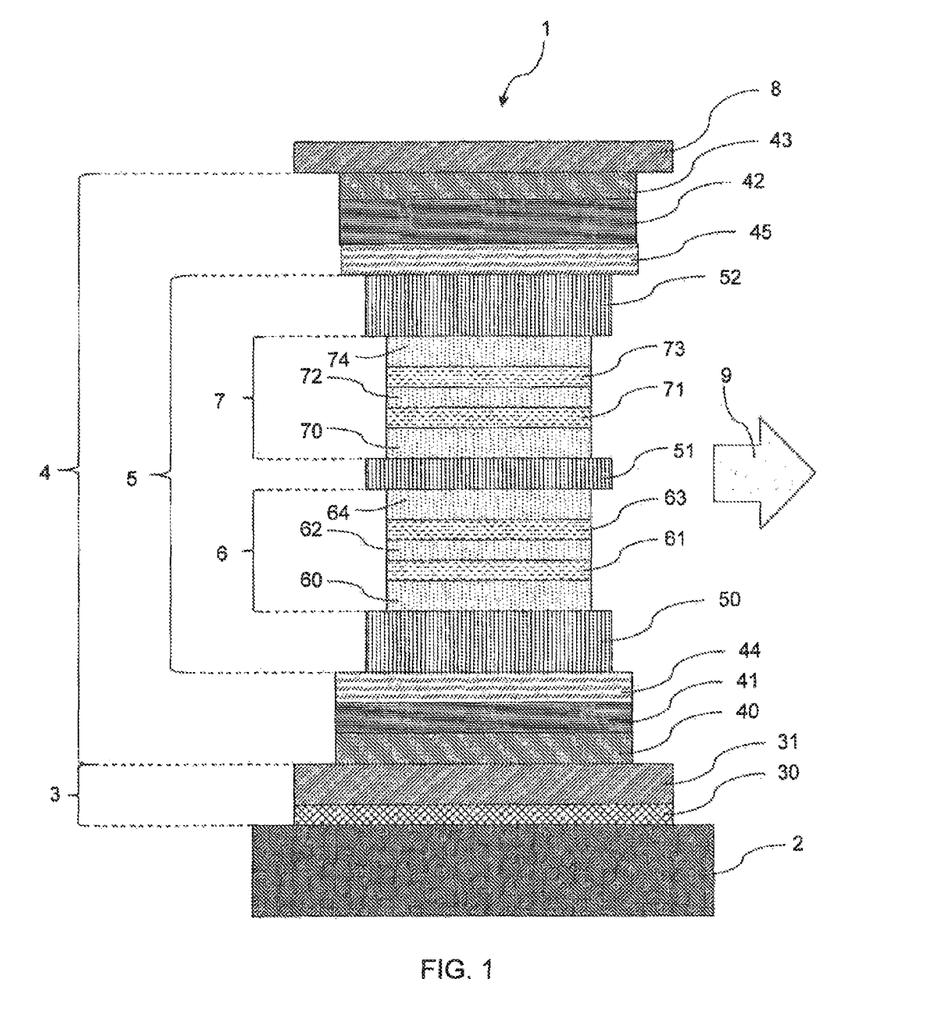
FIG. 1, a diagram of a light emission system according to a particular embodiment of the invention (two quantum wells, each composed of three quantum sub-wells).

On FIG. 1, a laser emission system (by wafer) according to a first embodiment of the invention is represented. The values of the thicknesses and compositions of layers are given hereinafter in order to generate a laser emission at 1.55 µm. The skilled person may however adapt the invention based on these data in order to achieve active zones, heterostructures and identical light emission systems, within the scope of the invention.

This laser emission system 1 comprises:
a substrate 2,
a pseudo-substrate 3,
a laser heterostructure 4, and
a contact layer 8.

The substrate 2 may be particularly in silicon (Si) or in Gallium antimonide (GaSb). It exhibits a doping of n type in order to be able to contact the laser by the rear side of the substrate.

In the case where the substrate 2 is a Gallium antimonide, the heterostructure 4 is arranged directly on the substrate 2.

In the case where the substrate 2 is in silicon, the latter must be covered with a pseudo-substrate 3, prior to the deposition of the heterostructure 4. This pseudo-substrate 3 corresponds to a buffer layer 31 of a thickness of 1.5 µm in Gallium antimonide (GaSb) epitaxied on a layer of nucleation 30 of a thickness of 5 nm in aluminium antimonide (AlSb). The layer 31 makes it possible to fix the lattice parameter of the pseudo-substrate crystal 3, as well as to remove the dislocations from the interface between the substrate 2 and the nucleation layer. This pseudo-substrate 3 thus serves as a platform for the epitaxy of the laser structure itself.

Always in the case where the substrate 2 is in silicon, a recurrent issue during the epitaxy of polar materials such as materials III -V on a nonpolar material such as silicon is the formation of defaults called "inversion walls". These defaults result in a rupture of the symmetry of the crystal III-V, leading to a degradation of the electrical and optical quality of the material. A classic method for removing these defaults is to slightly dis-orienting the substrate 2 in direction [001], for example by 4°, thus, making it possible for an optimal suppression of the inversion walls in the case of the epitaxy of AlSb (nucleation layer 31) on Si.

The laser heterostructure 4 is composed of:
two layers of gradual composition 40 and 43,
two layers of optical confinement 41 and 42, and
an active zone 5.

The lower layer of gradual composition 40 makes it possible to progressively pass from the pseudo-substrate 3 to the lower optical confinement layer 41. It is composed of Alx Ga1-x Asy Sb1-y and its thickness is of 300 nm. Its doping is similar to that of the pseudo-substrate 3.

The upper layer of gradual composition 43 is also used to progressively modulate the energy of the forbidden band of the material of the upper confinement layer 42. It is composed of $Al_xGa_{1-x}As_ySb_{1-y}$ and its thickness is of 300 nm. Its doping is opposed to that of the lower layer 40.

The lower confinement layer 41 is composed of $Al_{0.9}Ga_{0.1}As_{0.07}Sb_{0.93}$, its thickness is of 1500 nm. It is n-doped.

The upper confinement layer 42 is similar to the lower layer 41 (composed of $Al_{0.9}Ga_{0.1}As_{0.7}Sb_{0.93}$ of thickness 1500 nm), with however a p-type doping.

The active zone 5 is constituted of three barriers 50, 51 and 52, which separate two quantum wells 6 and 7.

The barriers 50, 51 and 52 are constituted of $Al_{0.35}Ga_{0.62}As_{0.03}Sb_{0.97}$ and exhibit a thickness of 20 nm each.

Each quantum well 6 or 7 is constituted of two intermediary barriers 61 and 63 (for well 6) or 71 and 73 (for well 7), which separate three quantum sub-wells 60, 62 and 64 for well 6) or 70, 72 and 74 (for well 7).

The intermediary barriers are constituted of $Al_{0.68}InSb$, of thickness 0.46 nm each, whereas the quantum sub-wells are constituted of $Ga_{0.8}InSb$, of thickness 2.2 nm each.

Thus made up, thanks to the addition of aluminium inside the quantum wells 6 and 7 (in very fine layers 61, 63, 71 and 73) and due to the great energy of the forbidden band of barriers in $Al_{0.68}InSb$, the gap of the material of the well is increased, which, in return, makes it possible to enlarge the well (hence to decrease the wavelength, particularly to make it lower than values such as 1.8 μm) while maintaining a high proportion of indium and thus a strong constraint. Here, the case of Quantum wells each composed of three sub-wells and two intermediary barriers has been represented. The skilled person will however know how to adapt these quantum wells with a different number of quantum sub-wells (and hence, intermediary barriers). Particularly, in order to achieve a quantum well with one single intermediary barrier and two sub-wells, an intermediary barrier may be placed in a well in $Al_{0.68}InSb$, of thickness 0.46 nm, separating two quantum sub-wells in $Ga_{0.9}InSb$, of thickness 2.4 nm each.

In order to achieve an emission 9 by the wafer, a waveguide is made by arranging two layers 44 and 45, in $Al_{0.35}Ga_{0.65}As_{0.03}Sb_{0.97}$, of a thickness of 300 nm each, such as to surround the active zone 5. These two layers are exhibited as two barriers (identical in composition to those inside the active zone), but with larger thicknesses.

In another embodiment, an emission through the surface based on this system may be provided.

In another embodiment, an electroluminescent diode based on this system may be provided.

Composition layers and/or gradual doping may also be added between the buffer layer and the first confinement layer, between this first layer and the first waveguide layer, between the second waveguide layer and the second confinement layer, and between this second layer and the upper contact layer.

FIG. 1 illustrates the case of an active zone with two quantum wells (and hence three barriers), but the skilled person will know how to adapt the invention to N quantum wells (and hence N+1 barriers), N able to be any integer. Likewise, each quantum well may have a different number of quantum sub-wells (and hence intermediary barriers), in so far as the compositions of the layers and the materials are arranged to generate the light emission at the required wavelength (1.55 μm in this example).

Figure 2:
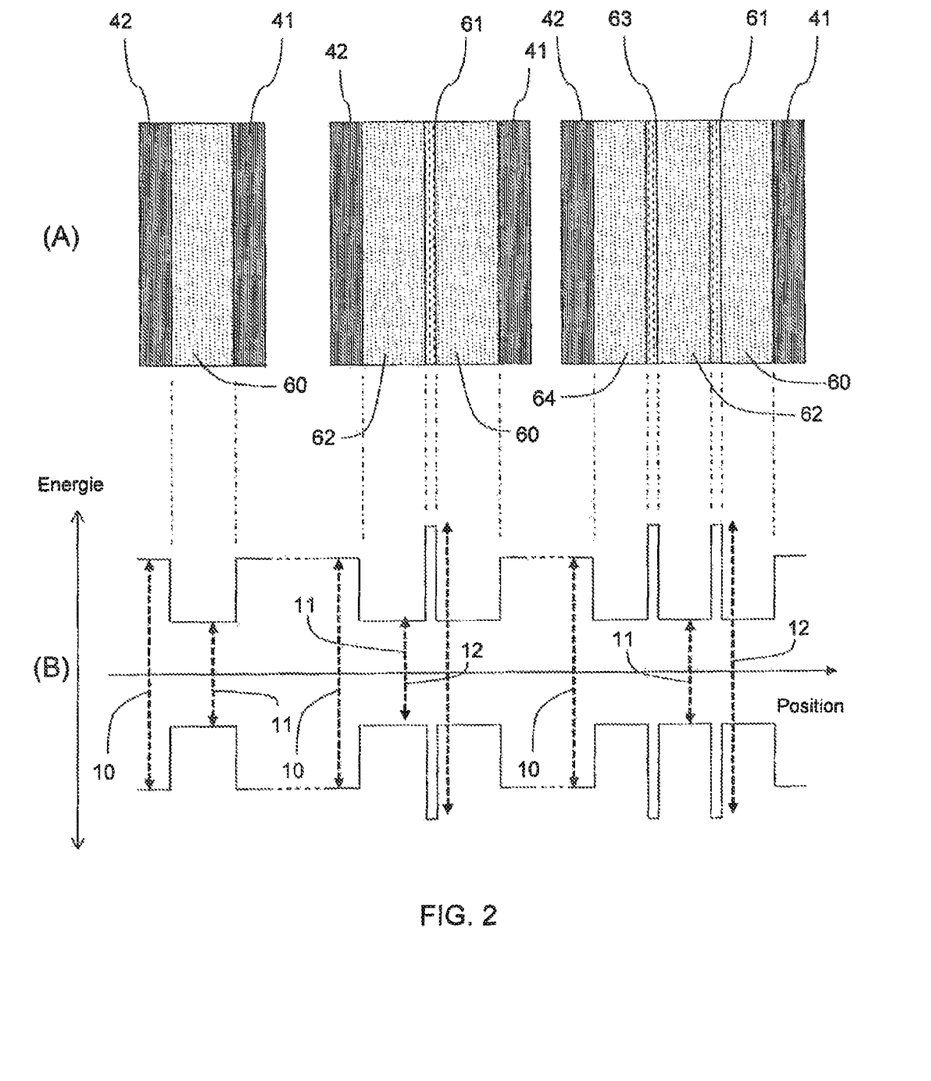
FIG. 2, a diagram illustrating the increase of the width of the quantum well offered by the addition of intermediary barriers making it possible to maintain the same emission wavelength in accordance with the invention, and FIG. 3, a diagram of an example of manufacturing method of a light emission system according to the invention; holes for a well of type I.

FIG. 2 illustrates the increase of the width of the quantum well offered by adding intermediary barriers in accordance with the invention. Part A of this FIG. 2 shows three types of active zone structures. Part B shows three levels of energy barriers induced by the types of structures of part A.

On part A of FIG. 2, on the left a structure of active zone in accordance with the prior art, with two barriers 41 and 42 (for example in $Al_{0.35}Ga_{0.65}As_{0.03}Sb_{0.97}$) surrounding a quantum well 60 (for example in Ga0.8 In Sb, of thickness 3.6 nm) is represented. To maintain a high constraint inside the active zone, it is preferable to have a sufficiently narrow well (see on the left of part B of FIG. 2), thus, hence limiting the reduction of the laser emission wavelength. Still on part A of FIG. 2, in the middle is represented an alternative structure of active zone according to the invention, with two barriers 41 and 42 (for example in $Al_{0.35}Ga_{0.65}As_{0.03}Sb_{0.97}$) surrounding a quantum well formed of an intermediary barrier 61 (in $Al_{0.68}$ In Sb, of thickness 0.46 nm) separating two sub-wells 60 and 62 (in $Ga_{0.8}$ In Sb, of thickness 2.4 nm). While maintaining a constraint inside the active zone which is equal or higher than that of the structure in accordance with the prior art (see the middle of part B of FIG. 2), the quantum well has been widened, and gone from 3.6 nm to 5.26 nm (twice 2.4 nm for the sub-wells and 0.46 nm for the intermediary barrier).

Still on part A of FIG. 2, on the right an alternative structure of the active zone according to the invention is represented, with two barriers 41 and 42 (for example in $Al_{0.35}Ga_{0.03}As_{0.03}Sb_{0.97}$) surrounding a quantum well formed of two intermediary barriers 61 and 63 (in $Al_{0.68}$ InSbn of thickness 0.46 nm) separating three sub-wells 60, 62 and 64 (in $Ga_{0.8}$ In Sb, of thickness 2.2 nm). While maintaining a constraint inside the active zone which is equal to that of the structure in accordance with the prior art, the quantum well has been widened further, and gone from 3.6 nm to 7.52 nm (three times 2.2 nm for the sub-wells and twice 0.46 for the intermediary barriers).

In each of the alternatives of the aforementioned invention, the thickness of the intermediary barriers is very low compared with those of the Quantum sub-wells, thus promoting a high coupling between these quantum sub-wells even on the inside of a quantum well.

In the above example, illustrated by FIG. 2, the element which has been added in the quantum well is aluminium. The skilled person will know however how to adapt the structure described with other elements able to increase the gap of the material inside the well, particularly with phosphorous, within the framework of the invention.

Figure 4:
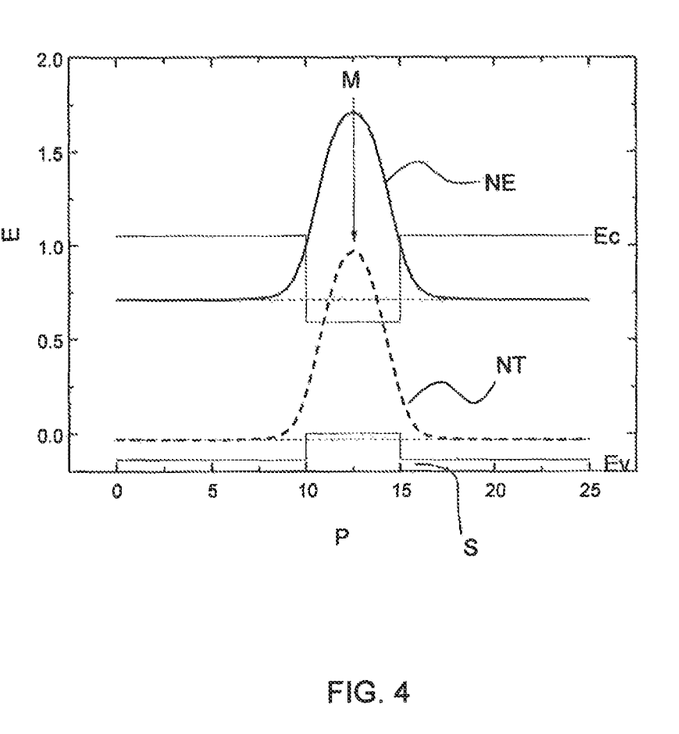

FIG. 4 represents a well of type I wherein the presence probability of the electrons and the holes are maximum in the same location of the structure.

The Y axis represents the energy in electron volts and the X axis represents the position in the structure. A first curve marked NE represents the presence probability of the electrons in the structure S and a second curve marked NT represents the presence probability of the holes in the structure. Ec represents an energy level relative to the electrons and Ev an energy level relative to the holes.

Figure 5:
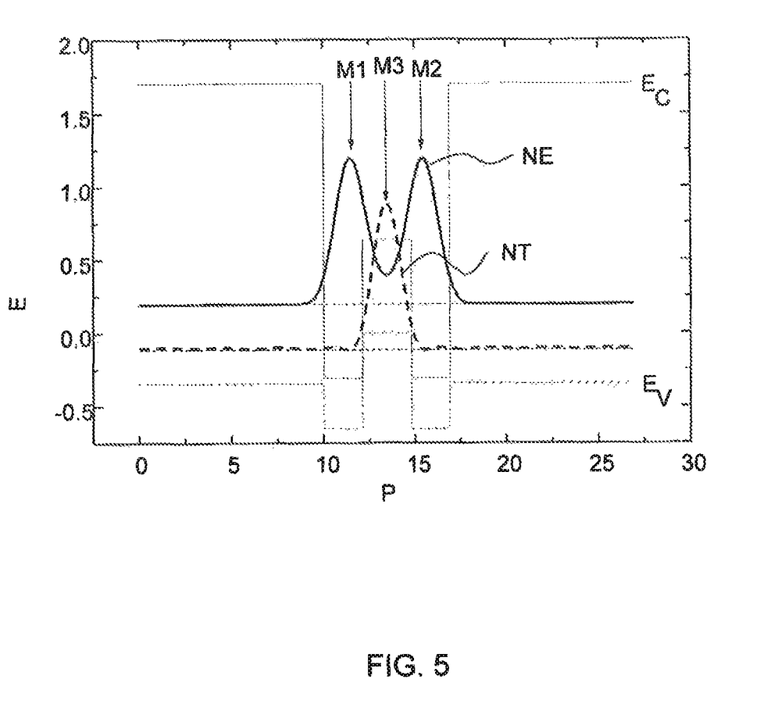
FIG. 5, a graphic representing the levels of electrons and holes for a well of type II.

FIG. 5 represents a well of type II wherein the presence probability of the electrons and the holes are maximum at different locations of the structure. The Y axis represents the energy in electron volts and the X axis represents the position in the structure. A first curve marked NE represents the presence probability of the electrons in the structure S and a second curve marked NT represents the presence probability of the holes in the structure. Ec represents an energy level relative to the electrons and Ev an energy level relative to the holes. The maximum presence of the curve NT is obtained at point M3. The curve NE comprises two maximas obtained at points M1 and M2.

Figure 6:
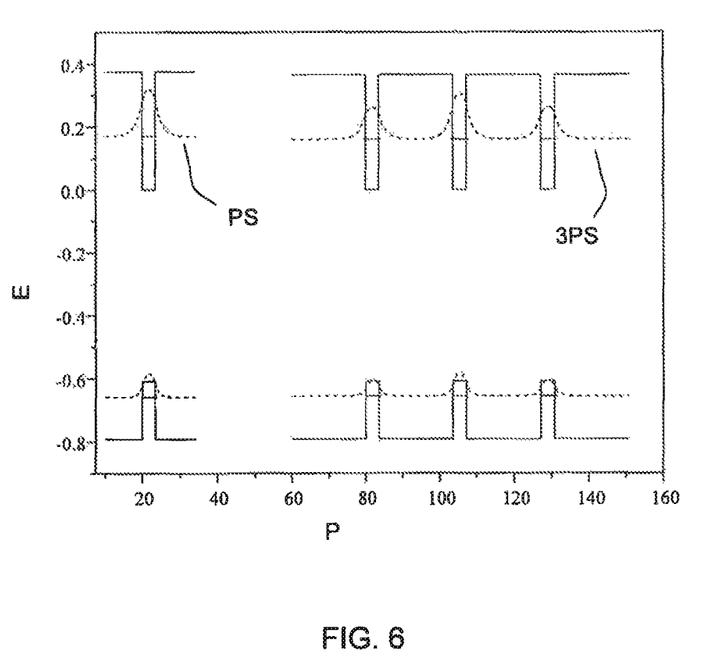
FIG. 6, a graphic representing the energy levels of the electrons and holes for a simple well and three uncoupled simple wells.

FIG. 6 represents uncoupled quantum wells. PS represents a simple well and 3PS represent 3 uncoupled simple wells separated by barriers. The presence curves of the electrons and holes are positioned with respect to each other as in the FIGS. 4 and 5, i.e., that the curve of the presence probability of electrons is positioned above that of the presence probability of the holes on the diagram.

The positions of the energy levels of the electrons and holes are identical whatever the number of quantum wells in the structure. In this example, for wells of 3.6 nm of $Ga_{0.8}In_{0.2}Sb$ the emission is obtained at 1.5 μm for a well just as for three wells.

Figure 7:
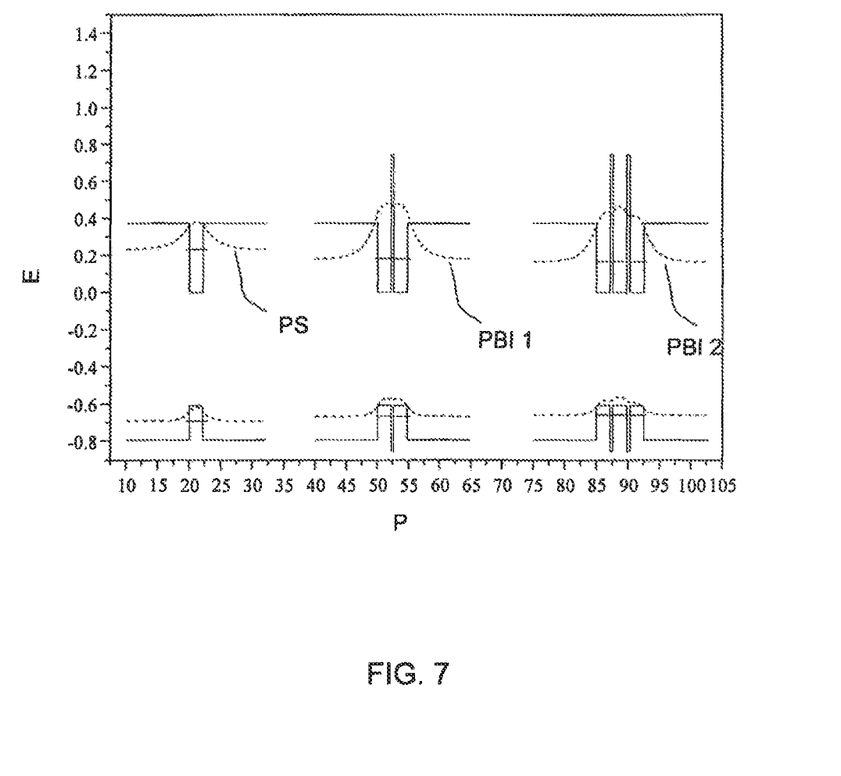
FIG. 7, a graphic representing the energy levels of the electrons and holes for a simple well and coupled intermediary barrier wells.

FIG. 7 represents coupled quantum wells. The standards are the same as for FIG. 6. The three curves PS, PBI1 and PBI2 show that the positions of the energy levels of the electrons and holes depend on the number of quantum sub-wells. A first curve PS represents the presence probability of the electrons (top curve) and holes (bottom curve) for a simple well. In this example the simple well comprises a layer of thickness 2.2 nm of $Ga_{0.8}In_{0.2}Sb$, the wavelength obtained is of 1.32 μm. The constraint of this type of quantum wells is marked Δa/a, it is equal in this example to 1.24%. The second curve PBI1 represents the presence probability of the electrons (top curve) and holes (bottom curve) for a well with intermediary barriers comprising two layers of thickness 2.2 nm of $Ga_{0.8}In_{0.2}Sb$ and a layer of thickness 0.46 nm of $Al_{0.68}In_{0.32}Sb$ with a wavelength of 4.45 μm.

The constraint of this type of quantum well is marked Δa/a, it is equal in this example to 1.35%.

The third curve PBI2 represents the presence probability of the electrons (top curve) and the holes (bottom curve) for a well with intermediary barriers comprising three layers of thickness 2.2 nm of $Ga_{0.8}In_{0.2}Sb$ and two layers of thickness 0.46 nm of $Al_{0.68}In_{0.32}Sb$ with a wavelength of 1.52 μm. In this example, for wells of thickness 2.2 μm in $Ga_{0.8}In_{0.2}Sb$, the three coupled sub-wells emit at 1.5 μm whereas the two wells emit at 1.45 μm and one single well emits at 1.32 μm. The constraint of this type of quantum well is marked Δa/a, it is equal in this example to 1.39%.

By comparing FIG. 7 wherein the wells are coupled and FIG. 6 wherein the wells are not coupled, for a same emission wavelength, in our example 1.5 μm, the coupling makes it possible to increase the total thickness of the emitting zone to 7.5 nm instead of 3.6 nm.

This has for effect to increase:
the presence probability of the carriers in the assembly comprising the sub-wells and the intermediary barriers and hence the radiative efficiency and;
the emitting volume hence the gain in a laser.

Figure 3:
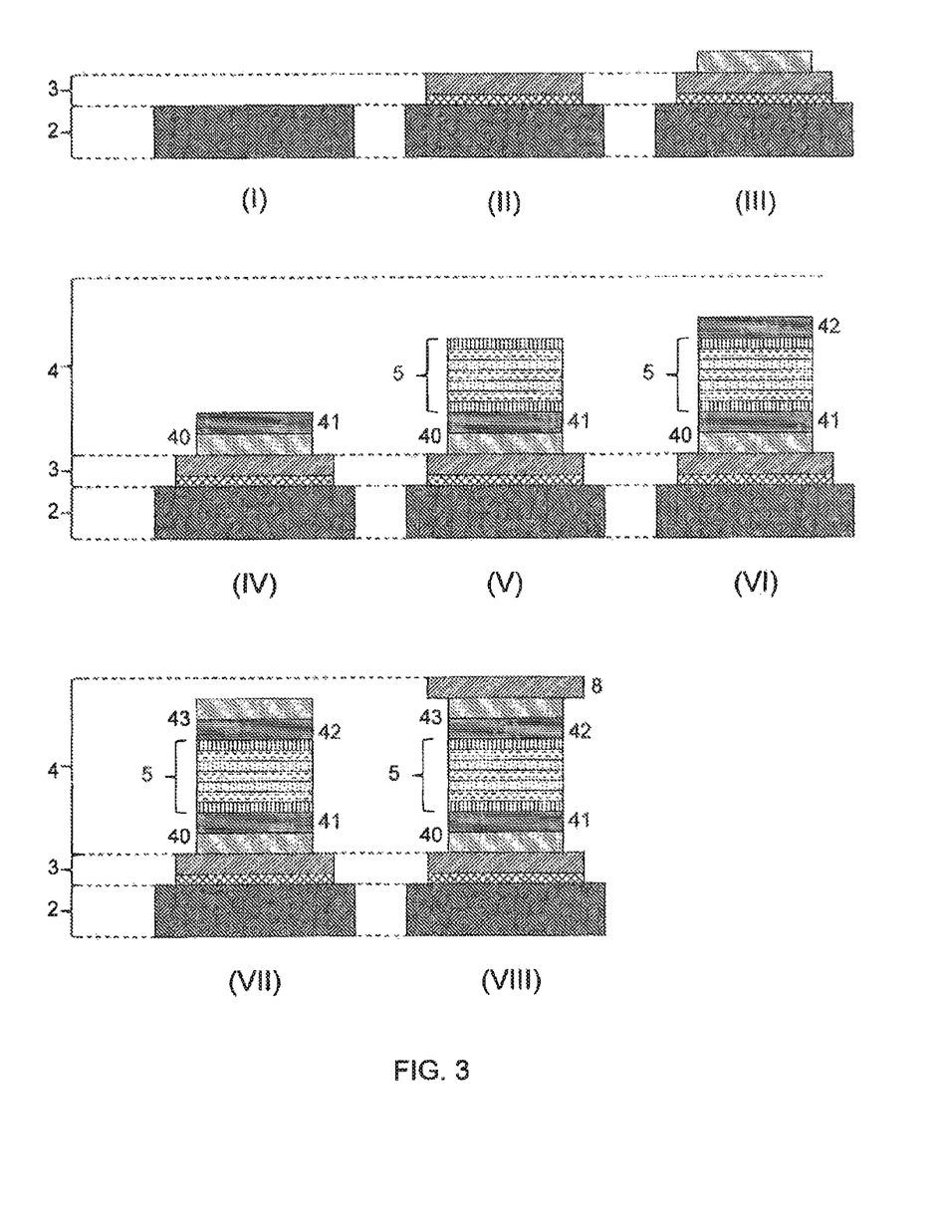

It has been represented on FIG. 3 a method for manufacturing a light emission system comprising an active zone according to the invention.

During the first step (1), it is proceeded to the preparation of the substrate 2 of silicon. This substrate is heated beforehand in order to be able to start an epitaxy on a perfectly clean surface. The required temperature of deoxidation depends on the material composing the substrate (550° C. for GaSb, 600° C. for GaAs, etc.). In the case of the silicon substrate, the temperature is much higher (higher than 900° C.) and the epitaxy reactors by molecular beams (MBE) used are not generally designed to reach such temperatures.

For this reason, the deoxidation is carried out in two steps, with a view to cleaning the substrate at a lower temperature. During a first step the substrate of Si is subjected to an ex situ chemical treatment, in the second step, the substrate is introduced in the growth chamber where it is heated at 800° C., then maintained at this temperature during at least thirty minutes. The progress of the surface state of the substrate 2 is monitored in situ by high energy electron diffraction by grazing incidence (RHEED).

During the second step (II) of the method, epitaxy of the pseudo-substrate 3 is achieved on the substrate 2, in the following manner:

The temperature of the substrate 2 is first of all brought down to 510° C.

The surface is put under flux of antimony atoms, equivalent to a pressure of $1.3 \cdot 10^{-6}$ Torr.

The nucleation layer 30 in AlSb is then epitaxied at 510° C. The deposition speed is of 1 Angstrom per second, by maintaining the same antimony flux as the previous step. The total thickness of AlSb deposited is of 5 nm and is n-doped by adding a tellurium flux. The dopant atom volume density in the nucleation layer is fixed to $2 \cdot 10^{18}$ cm$^{-3}$.

Still at a temperature of 510° C., a buffer layer 31 of GaSb (doped identically to the nucleation layer 30) is thus deposited. This layer of thickness 1.5 μm is epitaxied at a speed of 3 Angstrom per second.

In the case where the substrate is in GaSb, this first step (I) is achieved in a different manner. The GaSb substrate is mounted directly on a molybdenum support then introduced in the MBE reactor without chemical preparation. The sample is then degassed at 150° C. in the introduction chamber, then deoxidized at 550° C. during 20 minutes under Sb flux in the growth chamber. In this case, there is no nucleation layer and the buffer layer is less thick.

Steps III to VII then aim to achieve the heterostructure 4, within which is the active zone 5 according to the invention. During the third step (III), is deposited a lower layer of gradual composition 40, composed of $Al_x Ga_{1-x} As_y Sb_{1-y}$, of same doping as the pseudo-substrate 3, of thickness 300 nm, with a speed of 3 Angstrom per second.

During the fourth step (IV), is deposited the lower confinement layer 41, composed of $Al_{0.9} Ga_{0.1} As_{0.07} Sb_{0.93}$, of thickness 1500 nm, at 510° C., with a speed of 3 Angstrom per second. The temperature of the sample is thus brought down to 430° C. for the deposit of the active zone 5.

During the fifth step (V), is deposited this active zone 5. Here, an active zone is represented with a quantum well and two barriers, but, other alternatives of active zones can be easily carried out, in particular that described before and illustrated by FIG. 1.

This active zone may for example be composed of three quantum wells separated by barriers in $Al_{0.35} Ga_{0.065} As_{0.087} Sb_{0.97}$ of a thickness of 20 nm. Each quantum well provided with three layers $Ga_{0.8} In_{0.2} Sb$ of thickness 2.2 nm and of two layers in $Al_{0.68} In_{0.2} Sb$ of thickness 0.46 nm, arranged alternatively.

During the sixth step (VI), the upper confinement layer 42 is deposited, similar to the lower layer 41, with nevertheless a p-doping (beryllium). The epitaxy temperature of this layer is of 450° C.

During the seventh step (VII), the upper layer of gradual composition 43 is deposited, of a doping opposed to that of layer 42, composed of $Al_x Ga_{1-x} As_y Sb_{1-y}$, symmetrical to the lower layer 40, of thickness 300 nm.

Finally, during the eighth step (VIII), the contact layer 8 is deposited, of thickness 300 nm, composed in GaSb highly p-doped, at a temperature of 450° C.

The manufacturing method of the actual laser component thus starts, and uses standard techniques of optical photolithography, of chemical etching and metal deposits. Laser ribbons of a width arranged between 10 and 100 μm, of length arranged between 0.5 and 2 mm, and finally divided and mounted on copper subplates.

During the additional steps, with a view to achieving an emission by wafer, additional steps of depositing waveguide layers 44 and 45 are added such as described previously with reference to FIG. 1. The lower layer 44 is deposited between the step IV and the step V (i.e., between the layer 41 and the active zone 5). Whereas the upper layer 45 is deposited between the step V and the step VI (i.e. between the active zone 5 and the layer 42).

The optoelectronic component thus achieved makes it possible to obtain an emission at 1.55 μm, whereof the features are as follows:
- in the case of a substrate of GaSb, a continuous regime operation, at ambient temperature and with a density of threshold current of the order of 440 A/cm$^2$ (to compare with orders of magnitude of 4 kA/cm$^2$ of the components of the prior art), and
- in the case of a substrate of Si, a pulsed regime operation, for the first time at ambient temperature.

The aforementioned embodiments of the present invention are given by way of examples and are in no way limiting. It is obvious that the skilled person is able to achieve the different alternatives of the invention within the scope of the patent.

Particularly, it may be considered to achieve a laser emission system combining, in a same monolithic circuit, several optical and electronic functions, thus, making it possible to increase the number of functionalities as well as to reduce the manufacturing costs.

The invention claimed is:

1. An active zone for a light emission system, said active zone including a series of layers at least a portion of which is composed of antimony semiconductors III-V, said layers being arranged so as to form at least one quantum well surrounded by barriers with a view to generating a light emission, characterized in that said barriers comprising AlGaAsSb, said active zone also includes at least one layer comprising AlInSb capable of forming an intermediate barrier that is arranged relative to a quantum well so as to form at least two quantum sub-wells comprising GaInSb that are coupled to each other, the coupled quantum sub-wells and the intermediary barrier forming a unique quantum well of type I, wherein the thickness of the layer comprising AlInSb is smaller than the thickness of the coupled quantum sub-wells and the thickness of the quantum sub-wells is smaller than the thickness of the barriers.

2. The active zone according to claim 1, wherein all the layers of the active zone are made from antimony (Sb), indium (In), arsenic (As), gallium (Ga), as well as from at least an element amongst aluminium (Al) and phosphorous (P), in proportions and with thicknesses of layers determined such as to generate a laser emission at a wavelength substantially equal to 1.55 μm.

3. A heterostructure for a light emission system, comprising at least an optical confinement layer surrounding at least an active zone according to claim 1.

4. The heterostructure according to claim 3, wherein all the layers of said laser heterostructure are composed of antimony-based semiconductor III-V materials.

5. The heterostructure according to claim 4, arranged such as to form an electroluminescent diode.

6. The heterostructure according to claim 3, comprising at least two layers able to form a light waveguide with a view to generating a laser emission by the wafer of said heterostructure.

7. A light emission system comprising a heterostructure according to claim 3, deposited on a substrate.

8. The heterostructure according to claim 6, arranged such as to form an electroluminescent diode.

9. A use of an active zone according to claim 1, with a view to emitting a light beam at a wavelength substantially equal to 1.55 μm.

10. The use of an active zone according to claim 9, wherein the layers of the active zone are made from antimony (Sb), indium (In), arsenic (As), gallium (Ga), as well as from at least an element amongst aluminium (Al) and phosphorous (P), in proportions and with layer thicknesses determined such as to generate a laser emission at a wavelength substantially equal to 1.55 μm.

* * * * *